US012677584B2

(12) United States Patent
Lee

(10) Patent No.: US 12,677,584 B2
(45) Date of Patent: Jul. 7, 2026

(54) DISPLAY APPARATUS HAVING A REPAIR WIRING

(71) Applicant: LG DISPLAY CO., LTD., Seoul (KR)

(72) Inventor: Seon Woo Lee, Paju si (KR)

(73) Assignee: LG DISPLAY CO., LTD., Seoul (KR)

( * ) Notice: Subject to any disclaimer, the term of this patent is extended or adjusted under 35 U.S.C. 154(b) by 425 days.

(21) Appl. No.: 18/451,505

(22) Filed: Aug. 17, 2023

(65) Prior Publication Data

US 2024/0188409 A1 Jun. 6, 2024

(30) Foreign Application Priority Data

Dec. 6, 2022 (KR) ........................ 10-2022-0168599

(51) Int. Cl.
H10K 71/00 (2023.01)
H10K 59/121 (2023.01)
H10K 59/131 (2023.01)
H10K 59/80 (2023.01)
(52) U.S. Cl.
CPC ....... H10K 71/861 (2023.02); H10K 59/1213 (2023.02); H10K 59/131 (2023.02); H10K 59/8792 (2023.02)
(58) Field of Classification Search
CPC ............. H10K 71/861; H10K 59/1213; H10K 59/131; H10K 59/8792; H10K 59/126; H10K 59/88; H10K 59/12; H10K 59/80; H10K 59/81; H10K 59/82; H10K 59/123; H10K 59/124; H10K 50/805; H10K 59/805; H10D 86/40; H10D 86/60
See application file for complete search history.

(56) References Cited

U.S. PATENT DOCUMENTS

| | | | | | |
|---|---|---|---|---|---|
| 2014/0346475 A1* | 11/2014 | Cho | ...................... | H10D 86/423 | |
| | | | | 438/4 | |
| 2015/0364531 A1* | 12/2015 | Kim | ........................ | H10K 71/00 | |
| | | | | 438/4 | |
| 2016/0211314 A1* | 7/2016 | Kim | ...................... | H10K 59/123 | |
| 2019/0004382 A1* | 1/2019 | Ren | ........................ | G02F 1/1303 | |
| 2020/0212131 A1* | 7/2020 | Kim | .................... | H10K 59/1315 | |
| 2021/0202631 A1* | 7/2021 | Jo | ........................ | H10K 59/1213 | |
| 2022/0157914 A1* | 5/2022 | Kim | ........................ | G09G 3/006 | |
| 2022/0199746 A1* | 6/2022 | Kim | ........................ | H10K 59/88 | |
| 2022/0209210 A1 | 6/2022 | Kim et al. | | | |

(Continued)

FOREIGN PATENT DOCUMENTS

| | | |
|---|---|---|
| KR | 10-2017-0081038 A | 7/2017 |
| KR | 10-2020-0080896 A | 7/2020 |
| KR | 10-2022-0091975 A | 7/2022 |

*Primary Examiner* — Dao H Nguyen
(74) *Attorney, Agent, or Firm* — PnK IP LLC

(57) ABSTRACT

A display apparatus including a repair wiring is provided. The repair wiring may be disposed in each pixel area. A repair connecting area and a repair releasing area which are spaced away from a pixel driving circuit and a lower electrode of a light-emitting device may be defined in each pixel area. The repair wiring of each pixel area may overlap with the repair connecting area and the repair releasing area of the corresponding pixel area. The light-emitting device of each pixel area may be disposed on at least one insulating layer covering the repair wiring of the corresponding pixel area. Thus, in the display apparatus, a generation of a dark spot due to a repair releasing process may be minimized.

20 Claims, 9 Drawing Sheets

(56) References Cited

U.S. PATENT DOCUMENTS

| 2023/0209895 | A1* | 6/2023 | Shim ................. H10K 59/1213 |
| | | | 257/40 |
| 2023/0354658 | A1* | 11/2023 | You ...................... H10K 59/131 |
| 2025/0006128 | A1* | 1/2025 | Cao ...................... G09G 3/3233 |
| 2025/0048736 | A1* | 2/2025 | Lee ...................... H10D 86/441 |

* cited by examiner

DISPLAY APPARATUS HAVING A REPAIR WIRING

CROSS-REFERENCE TO RELATED APPLICATION

This application claims the priority of Korean Patent Application No. 10-2022 0168599, filed on Dec. 6, 2022, which is hereby incorporated by reference in its entirety.

BACKGROUND

Field of the Disclosure

The present disclosure relates to a display apparatus in which a repair wiring is disposed in each pixel area.

Description of the Background

Generally, a display apparatus provides an image to user. For example, the display apparatus may include a plurality of pixel area. Each of the pixel areas may realize a specific color. For example, a pixel driving circuit and a light-emitting device electrically connected to the pixel driving circuit may be disposed in each pixel area.

The pixel driving circuit may provide a driving current corresponding to a data signal to the light-emitting device according to a gate signal. The light-emitting device may emit light having a luminance corresponding to the driving current. For example, the light-emitting device may include a lower electrode, a light-emitting layer and an upper electrode, which are sequentially stacked.

The pixel driving circuit of each pixel area may be damaged by a particle generated during a process or an external impact. The pixel area in which the pixel driving circuit does not normally operate may be recognized as a dark spot by the user. Thus, in the display apparatus, a repair connection process of electrically connecting the light-emitting device of the pixel area where the pixel driving circuit is damaged to the pixel driving circuit of adjacent pixel area may be performed. For example, a repair wiring may be disposed in each pixel area, the lower electrode of each pixel area may include a repair protruding portion extending on the repair wiring of adjacent pixel area, and the repair connection process may include a process of electrically connecting between the repair protruding portion and the repair wiring.

In the display apparatus, when the light-emitting device connected to the pixel driving circuit of adjacent pixel area by the repair connection process does not normally operate, a repair release process of releasing an electrical connection by the repair wiring may be performed. For example, the repair release process may include a process of disconnecting the repair protruding portion electrically connected to the repair wiring of adjacent pixel area by the repair connection process. However, in the display apparatus, the upper electrode may be damaged by a laser using a process of disconnecting the repair protruding portion. Therefore, in the display apparatus, a dark spot due to the damage of the upper electrode may occur.

SUMMARY

Accordingly, the present disclosure is directed to a display apparatus that substantially obviates one or more problems due to limitations and disadvantages as described above.

More specifically, the present disclosure is to provide a display apparatus capable of preventing occur of a dark spot due to a repair release process.

In addition, the present disclosure is to provide a display apparatus capable of minimizing an effect of a repair release process on an upper electrode of a light-emitting device.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the present disclosure, as embodied and broadly described herein, there is provided a display apparatus comprising a device substrate. A pixel driving circuit, a light-emitting device and a repair wiring are disposed on a pixel area of the device substrate. The light-emitting device includes a lower electrode, a light-emitting layer and an upper electrode, which are sequentially stacked. The pixel driving circuit is electrically connected to the lower electrode of the light-emitting device and the repair wiring. The repair wiring overlaps with a repair connecting area and a repair releasing area of the pixel area. The repair connecting area and the repair releasing area are defined outside the pixel driving circuit and the lower electrode. The repair wiring is disposed closer to the device substrate than the lower electrode.

The repair releasing area may be defined between the repair connecting area and the pixel driving circuit. An end of the repair wiring may overlap with the repair connecting area.

The pixel driving circuit may include a driving thin film transistor. The lower electrode and the repair wiring may be electrically connected to a drain electrode of the driving thin film transistor.

The repair wiring may be disposed on a layer different from the drain electrode of the driving thin film transistor.

A light-blocking pattern may be disposed between the device substrate and the driving thin film transistor. The light-blocking pattern may overlap with a semiconductor pattern of the driving thin film transistor. The repair wiring may be disposed on a same layer as the light-blocking pattern.

The repair wiring may include a same material as the light-blocking pattern.

The repair wiring may be electrically connected to the light-blocking pattern.

The repair wiring may be in contact with the light-blocking pattern.

An over-coat layer may be disposed between the device substrate and the light-emitting device. A device buffer layer may be disposed between the device substrate and the over-coat layer. A lower passivation layer may be disposed between the device buffer layer and the over-coat layer. The pixel driving circuit may include at least one thin film transistor between the device buffer layer and the lower passivation layer. The repair wiring may be disposed between the device substrate and the device buffer layer.

The repair wiring may be in contact with an upper surface of the device substrate toward the light-emitting device.

In another aspect, there is provided a display apparatus comprising a device substrate. The device substrate includes a first pixel area and a second pixel area, which are disposed side by side in a first direction. A first light-emitting device, a first pixel driving circuit and a repair wiring are disposed on the first pixel area of the device substrate. The first light-emitting device includes a first lower electrode, a first light-emitting layer and a first upper electrode, which are sequentially stacked. The first pixel driving circuit is electrically connected to the first lower electrode of the first light-emitting device and the repair wiring. The repair wiring extends onto a repair connecting area of the first pixel area crossing a repair releasing area of the first pixel area. The repair releasing area and the repair connecting area of the first pixel area is disposed outside the first pixel driving circuit and the first lower electrode. A second light-emitting device and a second pixel driving circuit are disposed on the second pixel area of the device substrate. The second light-emitting device includes a second lower electrode, a second light-emitting layer and a second upper electrode, which are sequentially stacked. The second pixel driving circuit is insulated from the second light-emitting device. The first lower electrode and the second lower electrode are disposed on at least one insulating layer covering the repair wiring. The second lower electrode includes a repair protruding portion which extends in the first direction. The repair protruding portion of the second lower electrode is electrically connected to the repair wiring in the repair connecting area.

The repair protruding portion may be disposed on a same layer as the first lower electrode and the second lower electrode.

A portion of the repair wiring in the repair connecting area may be curved toward the repair protruding portion. The repair protruding portion may be in contact with a curved portion of the repair wiring.

An air-gap may be disposed in the repair connecting area. The air-gap may be surrounded by the curved portion of the repair wiring and the repair protruding portion.

An intermediate electrode may be disposed between the repair wiring and the repair protruding portion of the repair connecting area.

In still another aspect, there is provided a display apparatus comprising a device substrate. The device substrate includes a first pixel area and a second pixel area, which are disposed side by side in a first direction. A first light-emitting device, a first pixel driving circuit and a repair wiring are disposed on the first pixel area of the device substrate. The first light-emitting device includes a first lower electrode, a first light-emitting layer and a first upper electrode, which are sequentially stacked. The first pixel driving circuit is electrically connected to the first lower electrode of the first light-emitting device and the repair wiring. The repair wiring extends onto a repair connecting area of the first pixel area crossing a repair releasing area of the first pixel area. The repair releasing area and the repair connecting area of the first pixel area is disposed outside the first pixel driving circuit and the first lower electrode. A second light-emitting device and a second pixel driving circuit are disposed on the second pixel area of the device substrate. The second light-emitting device includes a second lower electrode, a second light-emitting layer and a second upper electrode, which are sequentially stacked. The second pixel driving circuit is insulated from the second light-emitting device. The first lower electrode and the second lower electrode are disposed on at least one insulating layer covering the repair wiring. The second lower electrode includes a repair protruding portion which extends in the first direction. The repair protruding portion of the second lower electrode overlaps with the repair wiring of the first pixel area.

The repair protruding portion does not overlap with the repair releasing area.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this disclosure, illustrate aspect (s) of the present disclosure and together with the description serve to explain the principle of the present disclosure.

In the drawings:

FIGS. 8 and 9 are views for explaining a repair connection process in the display apparatus according to the aspect of the present disclosure;

FIGS. 10 and 11 are views for explaining a repair release process in the display apparatus according to the aspect of the present disclosure.

DETAILED DESCRIPTION

Figure 1:
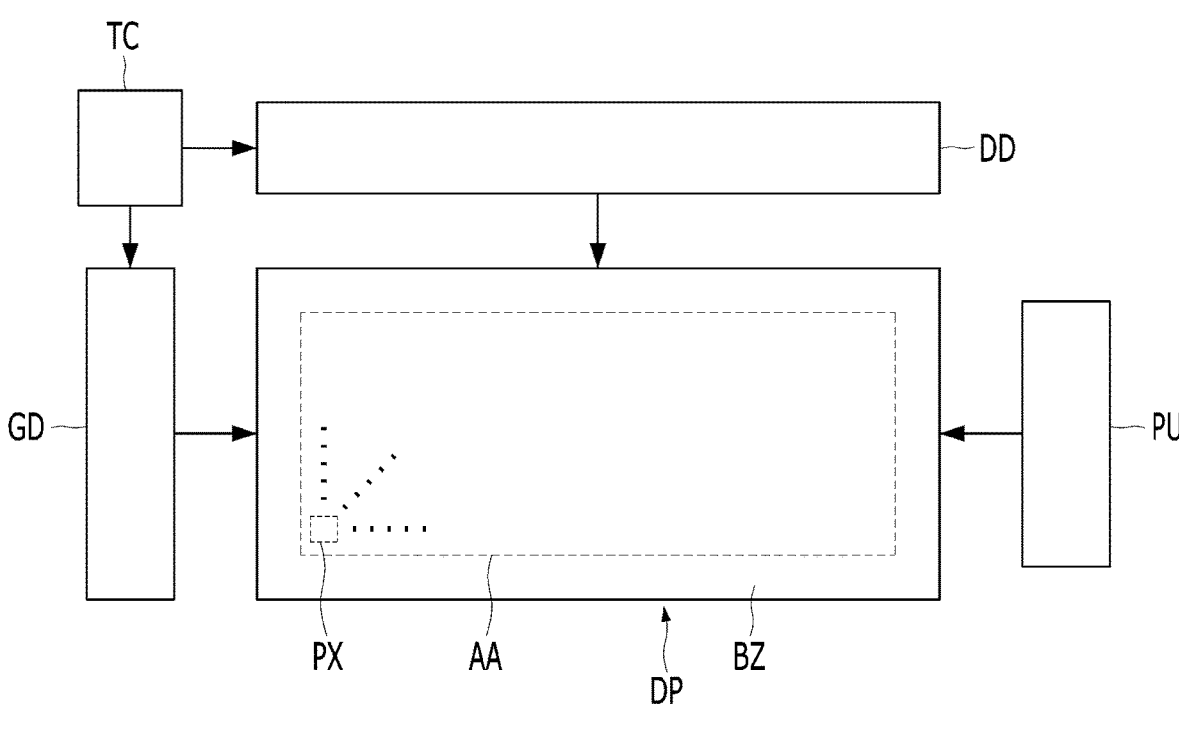
FIG. 1 is a view schematically showing a display apparatus according to an aspect of the present disclosure.

Hereinafter, details related to the configurations and operational effects of the aspects of the present disclosure will be clearly understood by the following detailed description with reference to the drawings, which illustrate some aspects of the present disclosure. Here, the aspects of the present disclosure are provided to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
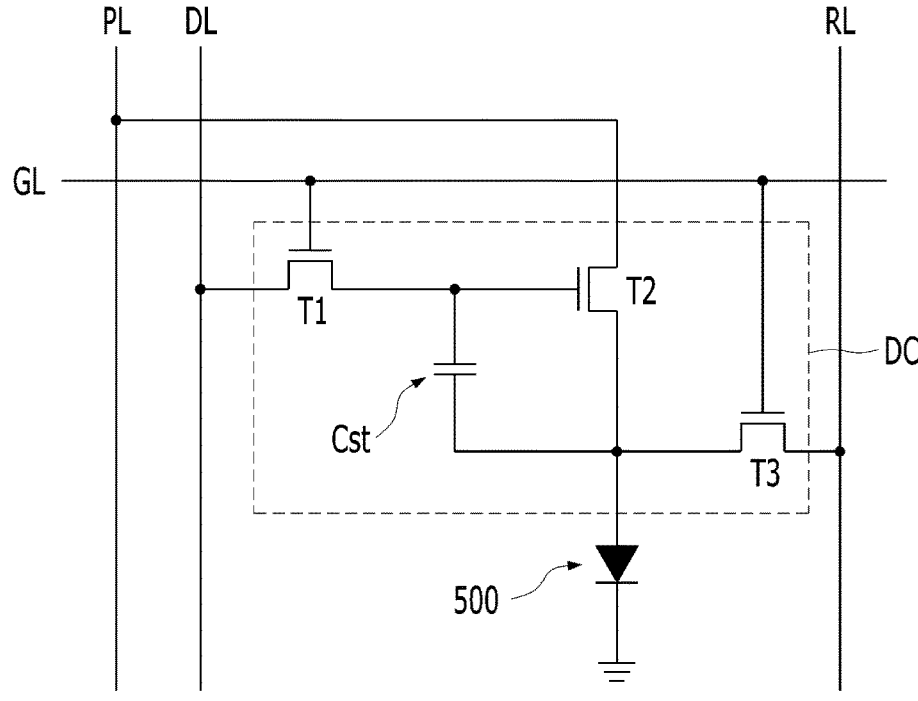
FIG. 2 is a view showing a circuit of a unit pixel area in the display apparatus according to the aspect of the present disclosure.

FIG. 1 is a view schematically showing a display apparatus according to an aspect of the present disclosure. FIG. 2 is a view showing a circuit of a unit pixel area in the display apparatus according to the aspect of the present disclosure.

Referring to FIGS. 1 and 2, the display apparatus according to the aspect of the present disclosure may include a display panel DP. The display panel DP may generate an image provided to a user. For example, the display panel DP may include a plurality of pixel area PX.

Various signals may be provided in each pixel area PX through signal wirings DL, GL, PL and RL. For example, the signal wirings DL, GL, PL and RL may include data lines DL applying a data signal, gate lines GL applying a gate signal, power voltage supply lines PL supplying a power voltage, and reference voltage supply lines RL applying a reference voltage. The data lines DL may be electrically connected to a data driver DD, and the gate lines GL may be electrically connected to a gate driver GD. The power voltage supply lines PL and the reference voltage supply lines RL may be electrically connected to a power unit PU. The gate driver GD, the data driver DD and the power unit PU may be disposed outside the display panel DP. For example, the display panel DP may include a display area AA in which the pixel areas PX are disposed, and a bezel area BZ disposed outside the display area AA, and the signal wirings DL, GL, PL and RL may cross the bezel area BZ.

The data driver DD and the gate driver GD may be controlled by a timing controller TC. For example, the data driver DD may receive digital video data and a source timing signal from the timing controller TC, and the gate driver GD may receive clock signals, reset signals and start signals from the timing controller TC.

Each of the pixel areas PX may realize a specific color. For example, a pixel driving circuit DC and a light-emitting device 500 electrically connected to the pixel driving circuit DC may be disposed in each pixel area PX. The pixel driving circuit DC may be electrically connected to the signal wirings DL, GL, PL and RL. For example, the pixel driving circuit DC may be electrically connected to one of the data lines DL, one of the gate lines GL, one of the power voltage supply lines PL and one of the reference voltage supply lines RL. The pixel driving circuit DC may supply a driving current corresponding to the data signal to the light-emitting device 500 according to the gate signal for one frame. For example, the pixel driving circuit DC may include a first thin film transistor T1, a second thin film transistor T2, a third thin film transistor T3 and a storage capacitor Cst.

The first thin film transistor T1 may include a first semiconductor pattern, a first gate insulating layer, a first gate electrode, a first source electrode and a first drain electrode. The first thin film transistor T1 may transmit the data signal to the second thin film transistor T2 according to the gate signal. For example, the first gate electrode of the first thin film transistor T1 may be electrically connected to the corresponding gate line GL, and the first source electrode of the first thin film transistor T1 may be electrically connected to the corresponding date line DL.

The second thin film transistor T2 may include a second semiconductor pattern, a second gate insulating layer, a second gate electrode, a second source electrode and a second drain electrode. The second thin film transistor T2 may generate the driving current corresponding to the data signal. For example, the second gate electrode of the second thin film transistor T2 may be electrically connected to the first drain electrode of the first thin film transistor T1, and the second source electrode of the second thin film transistor T2 may be electrically connected to the corresponding power voltage supply line PL. The light-emitting device 500 may be electrically connected to the second drain electrode of the second thin film transistor T2. For example, the second thin film transistor T2 may function as a driving thin film transistor applying the driving current to the light-emitting device 500.

The third thin film transistor T3 may include a third semiconductor pattern, a third gate insulating layer, a third gate electrode, a third source electrode and a third drain electrode. The third thin film transistor T3 may reset the storage capacitor Cst according to the gate signal. For example, the third gate electrode of the third thin film transistor T3 may be electrically connected to the corresponding gate line GL, the third source electrode of the third thin film transistor T3 may be electrically connected to the corresponding reference voltage supply line RL, and the third drain electrode of the third thin film transistor T3 may be electrically connected to the storage capacitor Cst.

The storage capacitor Cst may maintain a signal applied to the second gate electrode of the second thin film transistor T2 for one frame. For example, the storage capacitor Cst may be electrically connected between the second gate electrode and the second drain electrode of the second thin film transistor T2. The storage capacitor Cst may have a stacked structure of capacitor electrodes. For example, the storage capacitor Cst may include a first capacitor electrode electrically connected to the second gate electrode of the second thin film transistor T2 and a second capacitor electrode electrically connected to the second drain electrode of the second thin film transistor T2. The third drain electrode of the third thin film transistor T3 may be connected to the second capacitor electrode. For example, the third drain electrode of the third thin film transistor T3 may be electrically connected to the second drain electrode of the second thin film transistor T2.

Figure 3:
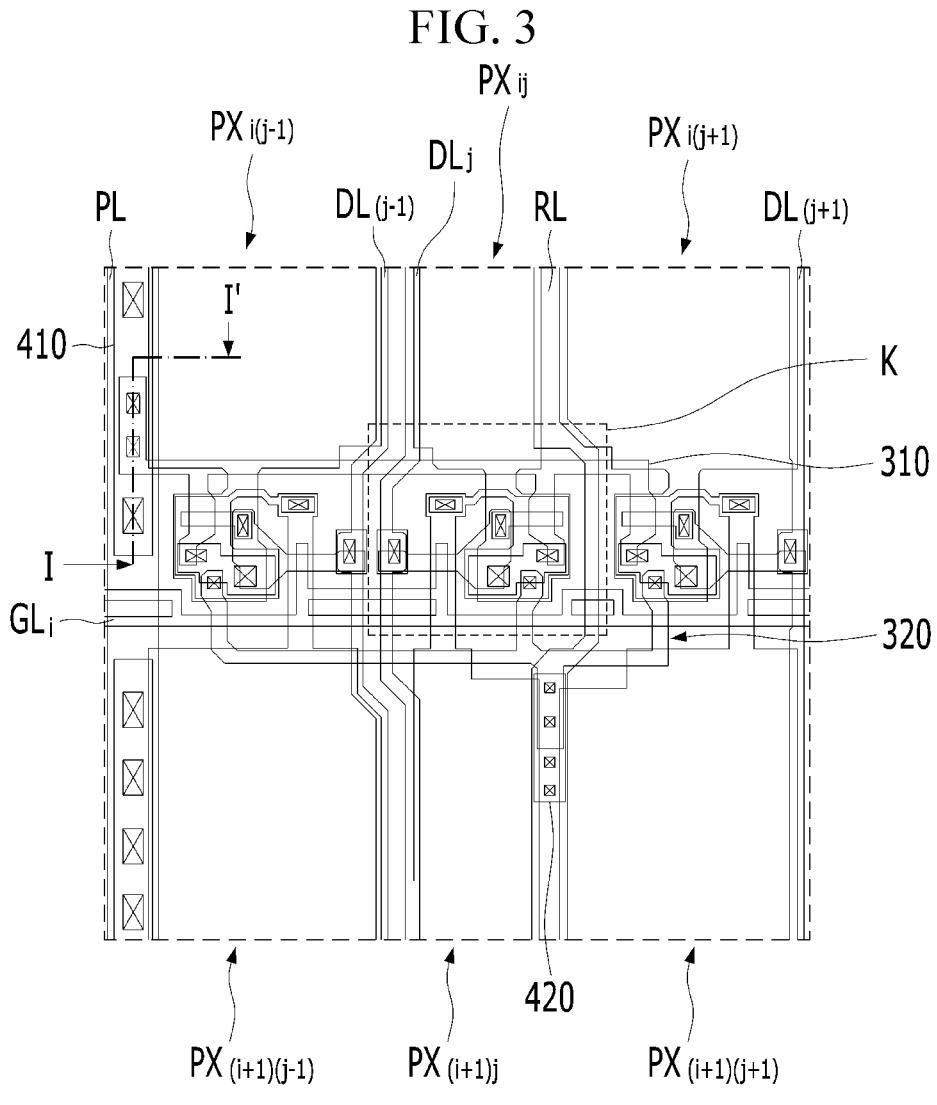
FIG. 3 is a view showing a portion of a display area in the display apparatus according to the aspect of the present disclosure.
Figure 4:
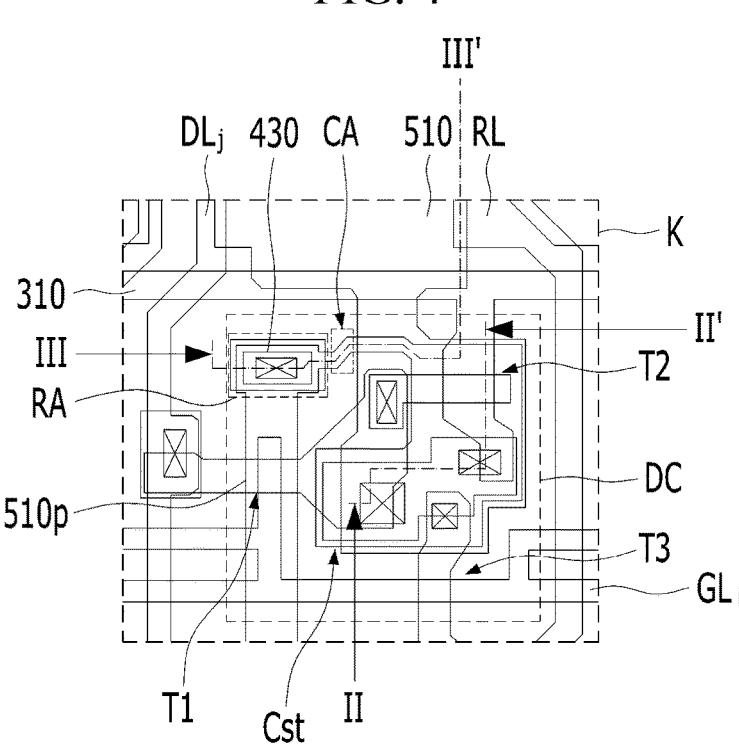
FIG. 4 is an enlarged view of K region in FIG. 3.
Figure 5:
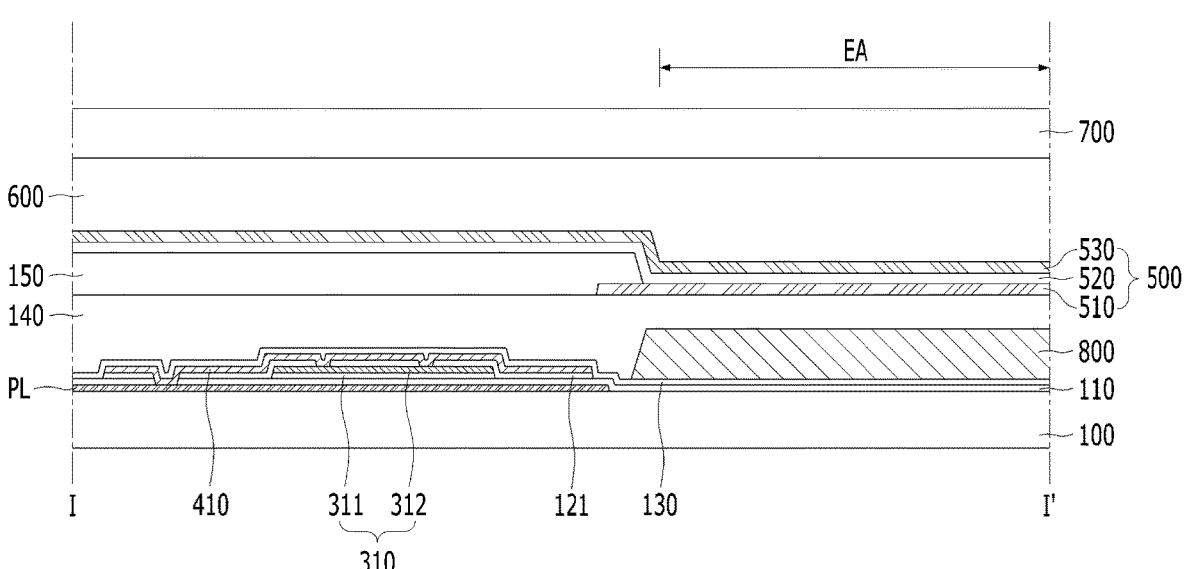
FIG. 5 is a view taken along I-I' of FIG. 3.
Figure 6:
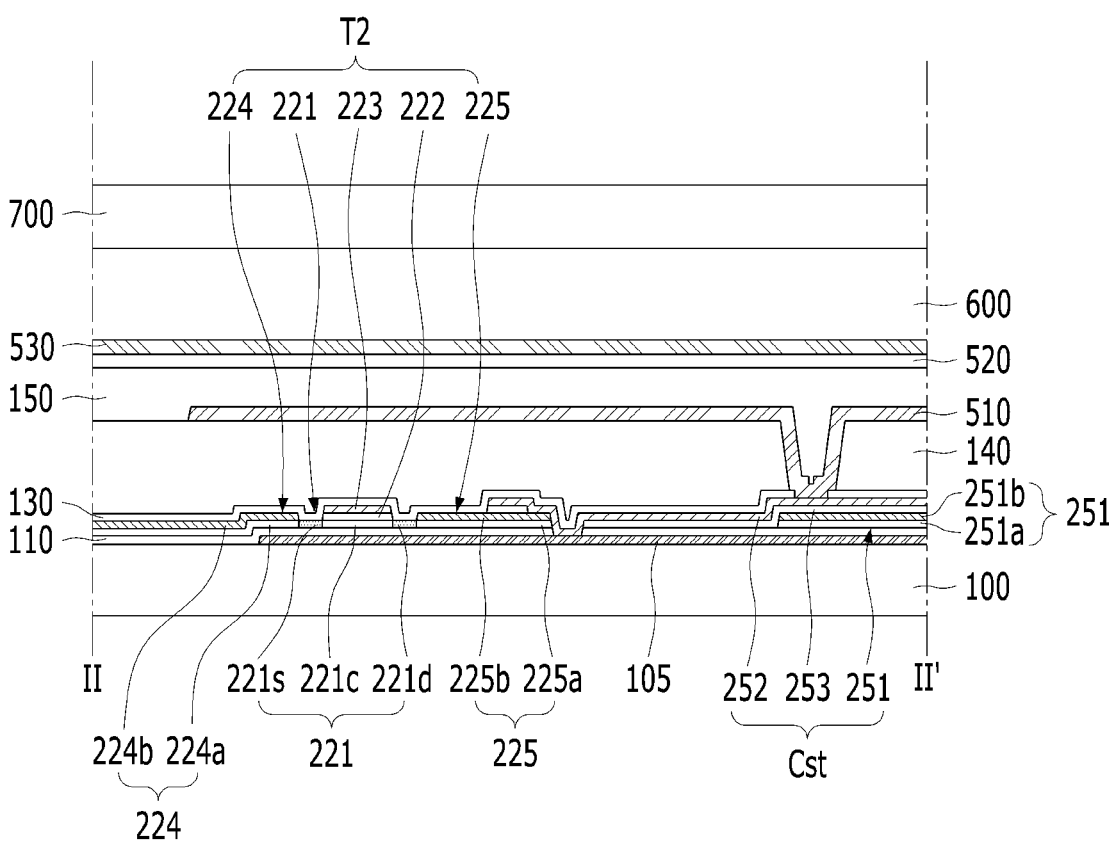
FIG. 6 is a view taken along II-II' of FIG. 4.
Figure 7:
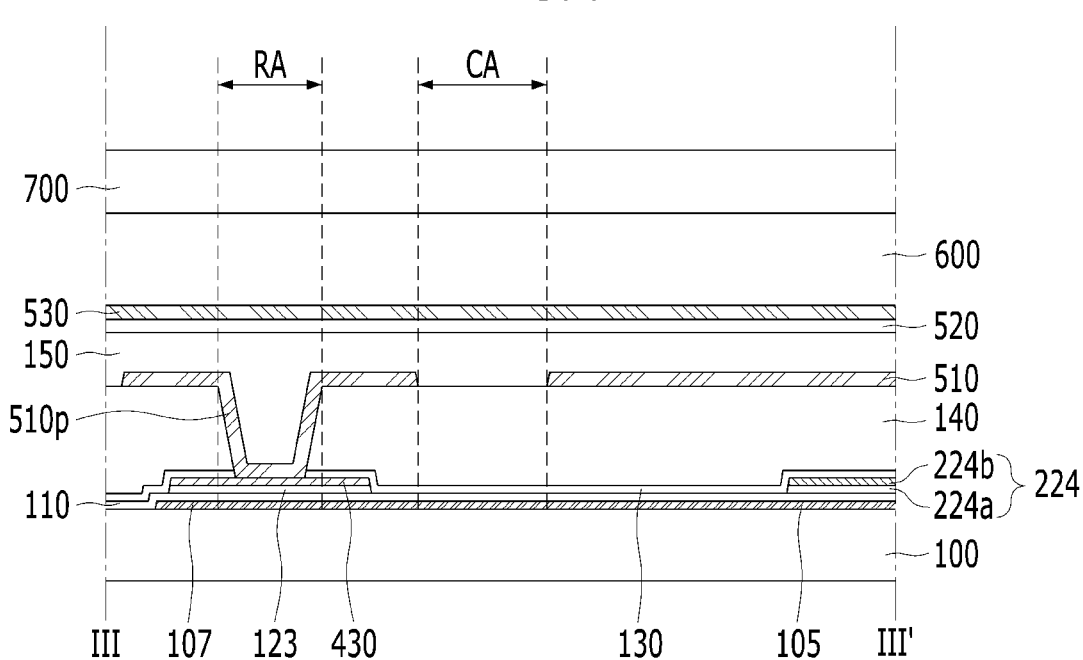
FIG. 7 is a view taken along III-III' of FIG. 4.

FIG. 3 is a view showing a portion of a display area in the display apparatus according to the aspect of the present disclosure. FIG. 4 is an enlarged view of K region in FIG. 3. FIG. 5 is a view taken along I-I' of FIG. 3. FIG. 6 is a view taken along II-II' of FIG. 4. FIG. 7 is a view taken along III-III' of FIG. 4.

Referring to FIGS. 3 to 7, in the display apparatus according to the aspect of the present disclosure, the data lines $DL_{(j-1)}$, $DL_j$ and $DL_{(j+1)}$ may extend in a first direction, the gate lines GL; extend in a second direction perpendicular to the first direction, and the pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be arranged in a matrix shape within regions defined by the data lines $DL_{(j-1)}$, $DL_j$ and $DL_{(j+1)}$ and the gate lines $GL_i$. For example, each of the pixel areas $PX_{i(j-1)}$, $PX_{ij}$, $PX_{i(j+1)}$, $PX_{(i+1)(j-1)}$, $PX_{(i+1)j}$ may be connected to a same data line $DL_{(j-1)}$, $DL_j$ and $DL_{(j+1)}$ as adjacent pixel area $PX_{i(j-1)}$, $PX_{ij}$, $PX_{i(j+1)}$, $PX_{(i+1)(j-1)}$, $PX_{(i+1)j}$ in the first direction. Each of the pixel areas $PX_{i(j-1)}$, $PX_{ij}$, $PX_{i(j+1)}$, $PX_{(i+1)(j-1)}$, $PX_{(i+1)j}$ may be connected to a same gate lines GL; as adjacent pixel area $PX_{i(j-1)}$, $PX_{ij}$, $PX_{i(j+1)}$, $PX_{(i+1)(j-1)}$, $PX_{(i+1)j}$ in the second direction.

The power voltage supply lines PL and the reference voltage supply lines RL may extend in the first direction. For example, the power voltage supply lines PL and the reference voltage supply lines RL may intersect the gate lines $GL_i$. A plurality of the data line $DL_{(j-1)}$, $DL_j$ and $DL_{(j+1)}$ may be disposed between one of the power voltage supply lines PL and one of the reference voltage supply lines RL. For example, the pixel areas $PX_{i(j-1)}$, $PX_{ij}$, $PX_{i(j+1)}$, $PX_{(i+1)(j-1)}$, $PX_{(i+1)j}$ between one of the power voltage supply lines PL and one of the reference voltage supply lines RL may be electrically connected to the corresponding power voltage supply line PL through a first connection wiring 310 and electrically connected to the corresponding reference voltage supply line RL through a second connection wiring 320. The first connection wiring 310 and the second connection wiring 320 may extend in the second direction. For example, the first connection wiring 310 and the second connection wiring 320 may intersect the data line $DL_{(j-1)}$, $DL_j$ and $DL_{(j+1)}$ between the corresponding power voltage supply line PL and the corresponding reference voltage supply line RL.

The first connection wiring 310 may have a multi-layer structure. For example, the first connection wiring 310 may include a first lower wiring layer 311 on a device substrate 100 and a first upper wiring layer 312 on the first lower wiring layer 311, as shown in FIG. 5. The device substrate 100 may include an insulating material. The device substrate 100 may include a transparent material. For example, the device substrate 100 may include glass or plastic.

The second connection wiring 320 may have a multi-layer structure. The second connection wiring 320 may have a same structure as the first connection wiring 310. For example, the second connection wiring 320 may have a stacked structure of a second lower wiring layer and a second upper wiring layer. The second connection wiring 320 may be formed simultaneously with the first connection wiring 310. For example, the second lower wiring layer may include a same material as the first lower wiring layer 311, and the second upper wiring layer may include a same material as the first upper wiring layer 312.

A plurality of insulating layers 110, 130, 140 and 150 for preventing unnecessary electrical connection may be disposed on the device substrate 100. For example, a device buffer layer 110, a lower passivation layer 130, an over-coat layer 140 and a bank insulating layer 150 may be sequentially stacked on the device substrate 100.

The device buffer layer 110 may be disposed close to the device substrate 100. The device buffer layer 110 may include an insulating material. For example, the device buffer layer 110 may include an inorganic insulating material, such as silicon oxide (SiOx), silicon nitride (SiNx) and silicon oxide nitride (SiON). The device buffer layer 110 may have a multi-layer structure. For example, the device buffer layer 110 may have a stacked structure of a layer made of silicon oxide (SiOx) and a layer made of silicon nitride (SiNx).

The device buffer layer 110 may prevent pollution due to the device substrate 100 in a process of forming the thin film transistors T1, T2 and T3 of each pixel driving circuit DC. For example, an upper surface of the device substrate 100 toward the thin film transistors T1, T2 and T3 of each pixel driving circuit DC may be completely covered by the device buffer layer 110. The thin film transistors T1, T2 and T3 of each pixel driving circuit DC may be disposed on the device buffer layer 110. For example, the second semiconductor pattern 221, the second gate insulating layer 222, the second gate electrode 223, the second source electrode 224 and the second drain electrode 225 of the second thin film transistor functioning as the driving thin film transistor of each pixel driving circuit DC may be disposed on the device buffer layer 110, as shown in FIG. 6.

The second semiconductor pattern 221 may be disposed close to the device buffer layer 110. For example, the second semiconductor pattern 221 may be in direct contact with an upper surface of the device buffer layer 110 opposite to the device substrate 100. The second semiconductor pattern 221 may include a semiconductor material. For example, the second semiconductor pattern 221 may include an oxide semiconductor, such as IGZO.

The second semiconductor pattern 221 may include a source region 221s, a channel region 221c and a drain region 221d. The channel region 221c may be disposed between the source region 221s and the drain region 221d. The source region 221s and the drain region 221d may have a resistance lower than the channel region 221c. For example, the source region 221s and the drain region 221d may include a conductive region of an oxide semiconductor. The channel region 221c may include a region of an oxide semiconductor which is not conductorized.

The second gate insulating layer 222 may be disposed on the second semiconductor pattern 221. The second gate insulating layer 222 may include an insulating material. For example, the second gate insulating layer 222 may include an inorganic insulating material, such as silicon oxide (SiOx) and silicon nitride (SiNx). The second gate insulating layer 222 may overlap with a portion of the second semiconductor pattern 221. For example, the second gate insulating layer 222 may overlap with the channel region 221c of the second semiconductor pattern 221. The source region 221s and the drain region 221d of the second semiconductor pattern 221 may be disposed outside the second gate insulating layer 222.

The second gate electrode 223 may be disposed on the second gate insulating layer 222. The second gate electrode 223 may include a conductive material. For example, the second gate electrode 223 may include a metal, such as aluminum (Al), chrome (Cr), copper (Cu), molybdenum (Mo), titanium (Ti) and tungsten (W). The second gate electrode 223 may be disposed between the source region 221s and the drain region 221d of the second semiconductor pattern 221. The second gate electrode 223 may overlap with the channel region 221c of the second semiconductor pattern 221. For example, the second gate electrode 223 may be insulated from the second semiconductor pattern 221 by the second gate insulating layer 222. The channel region 221c of the second semiconductor pattern 221 may have an electrical conductivity corresponding to a voltage applied to the second gate electrode 223.

The second source electrode 224 may be electrically connected to the source region 221*s* of the second semiconductor pattern 221. The second source electrode 224 may have a multi-layer structure. For example, the second source electrode 224 may include a lower source layer 224*a* and an upper source layer 224*b* on the lower source layer 224*a*. The second source electrode 224 may be disposed on a same layer as the second semiconductor pattern 221. For example, the lower source layer 224*a* may be in direct contact with the upper surface of the device buffer layer 110. A side of the source region 221*s* of the second semiconductor pattern 221 may be in direct contact with a side of the lower source layer 224*a*. The lower source layer 224*a* may include a same material as the second semiconductor pattern 221. For example, the lower source layer 224*a* may be physically connected to the source region 221*s* of the second semiconductor pattern 221 to be viewed as a single pattern.

The upper source layer 224*b* may be in direct contact with an upper surface of the lower source layer 224*a* opposite to the device substrate 100. The upper source layer 224*b* may have a resistance lower than the lower source layer 224*a*. For example, the upper source layer 224*b* may include a metal, such as aluminum (Al), chrome (Cr), copper (Cu), molybdenum (Mo), titanium (Ti) and tungsten (W). Thus, in the display apparatus according to the aspect of the present disclosure, the second source electrode 224 may have a sufficiently low resistance, and a contact resistance between the source region 221*s* of the second semiconductor pattern 221 and the second source electrode 224 may be minimized.

The second drain electrode 225 may be electrically connected to the drain region 221*d* of the second semiconductor pattern 221. The second drain electrode 225 may have a multi-layer structure. The second drain electrode 225 may have a same structure as the second source electrode 224. For example, the second drain electrode 225 may have a stacked structure of a lower drain layer 225*a* and an upper drain layer 225*b*. The second drain electrode 225 may be formed simultaneously with the second source electrode 224. For example, the lower drain layer 225*a* may include a same material as the lower source layer 224*a*, and the upper drain layer 225*b* may include a same material as the upper source layer 224*b*.

The second drain electrode 225 may be disposed on a same layer as the second source electrode 224. For example, the lower drain layer 225*a* may be in direct contact with the upper surface of the device buffer layer 110. A side of the drain region 221*d* of the second semiconductor pattern 221 may be in direct contact with a side of the lower drain layer 225*a*. For example, the lower drain layer 225*a* may be physically connected to the drain region 221*d* of the second semiconductor pattern 221 to be viewed as a single pattern. The upper drain layer 225*b* may be in direct contact with an upper surface of the lower drain layer 225*a* opposite to the device substrate 100. Thus, in the display apparatus according to the aspect of the present disclosure, the second drain electrode 225 may have a sufficiently low resistance, and a contact resistance between the drain region 221*d* of the second semiconductor pattern 221 and the second drain electrode 225 may be minimized.

The first thin film transistor T1 and the third thin film transistor T3 of each pixel driving circuit DC may have a stacked structure same as the second thin film transistor T2 of the corresponding pixel driving circuit DC. For example, the first source electrode, the first drain electrode, the third source electrode and the third drain electrode of each pixel driving circuit DC may have a two-layer structure. A lower source layer of the first source electrode and a lower drain layer of the first drain electrode in each pixel driving circuit DC may be physically connected to the first semiconductor pattern of the corresponding pixel driving circuit DC to be viewed as a single pattern. A lower source layer of the third source electrode and a lower drain layer of the third drain electrode in each pixel driving circuit DC may be physically connected to the third semiconductor pattern of the corresponding pixel driving circuit DC to be viewed as a single pattern. An upper source layer of the first source electrode, an upper drain layer of the first drain electrode, an upper source layer of the third source electrode and an upper drain layer of the third drain electrode in each pixel driving circuit DC may include a same material as the upper source layer 224*b* of the second source electrode 224 and the upper drain layer 225*b* of the second drain electrode 225 in the corresponding pixel driving circuit DC. The first gate insulating layer and the third gate insulating layer of each pixel driving circuit DC may include a same material as the second gate insulating layer 222 of the corresponding pixel driving circuit DC. The first gate electrode and the third gate electrode of each pixel driving circuit DC may include a same material as the second gate electrode 223 of the corresponding pixel driving circuit DC. Thus, in the display apparatus according to the aspect of the present disclosure, a formation process of each pixel driving circuit DC may be simplified.

The gate lines GL; may be formed simultaneously with the second gate electrode 223 of each pixel driving circuit DC. The gate lines GL; may be disposed on a same layer as the second gate electrode 223 of each pixel driving circuit DC. The gate lines GL; may include a same material as the second gate electrode 223 of each pixel driving circuit DC. For example, the first gate electrode and the third gate electrode of each pixel driving circuit DC may be in direct contact with the corresponding gate lines GL*i*. Thus, in the display apparatus according to the aspect of the present disclosure, a process of electrically connecting each pixel driving circuit DC to the corresponding gate lines GL; may be simplified.

The first connection wiring 310 and the second connection wiring 320 may be formed using a process of forming the thin film transistors T1, T2 and T3 of each pixel driving circuit DC. Each of the first connection wiring 310 and the second connection wiring 320 may have a multi-layer structure. For example, the first connection wiring 310 and the second connection wiring 320 may be formed simultaneously with the second source electrode 224 and the second drain electrode 225 of each pixel driving circuit DC. The first lower wiring layer 311 of the first connection wiring 310 and the second lower wiring layer of the second connection wiring 320 may include a same material as the lower source layer 224*a* of the second source electrode 224 and the lower drain layer 225*a* of the second drain electrode 225 in each pixel driving circuit DC. The first upper wiring layer 312 of the first connection wiring 310 and the second upper wiring layer of the second connection wiring 320 may include a same material as the upper source layer 224*b* of the second source electrode 224 and the upper drain layer 225*b* of the second drain electrode 225 in each pixel driving circuit DC. Thus, in the display apparatus according to the aspect of the present disclosure, process efficiency may be improved.

The storage capacitor Cst of each pixel driving circuit DC may be formed using a process of forming the thin film transistors T1, T2 and T3 of the corresponding pixel driving circuit DC. For example, the first capacitor electrode 251 of the storage capacitor Cst in each pixel driving circuit DC may be formed simultaneously with the second source electrode 224 and the second drain electrode 225 of the corresponding pixel driving circuit DC.

The first capacitor electrode 251 may have a stacked structure same as the second source electrode 224 and the second drain electrode 225. For example, the first capacitor electrode 251 may have a stacked structure of a lower electrode layer 251$a$ and an upper electrode layer 251$b$. The lower electrode layer 251$a$ may include a same material as the second lower source layer 224$a$ of the second source electrode 224 and the second lower drain layer 225$a$ of the second drain electrode 225. The upper electrode layer 251$b$ may include a same material as the second upper source layer 224$b$ of the second source electrode 224 and the second upper drain layer 225$b$ of the second drain electrode 225. The first capacitor electrode 251 may be disposed on a same layer as the second source electrode 224 and the second drain electrode 225. For example, the lower electrode layer 251$a$ may be in direct contact with the upper surface of the device buffer layer 110. The upper electrode layer 251$b$ may be in direct contact with an upper surface of the lower electrode layer 251$a$ opposite to the device substrate 100.

The second capacitor electrode 252 of the storage capacitor Cst in each pixel driving circuit DC may be formed simultaneously with the second gate electrode 223 of the corresponding pixel driving circuit DC. For example, the second capacitor electrode 225 of each pixel driving circuit DC may include a same material as the second gate electrode 223 of the corresponding pixel driving circuit DC.

The storage capacitor Cst of each pixel driving circuit DC may further include a capacitor insulating layer 253 between the first capacitor electrode 251 and the second capacitor electrode 252. The capacitor insulating layer 253 may include an insulating material. For example, the first capacitor electrode 251 of each pixel driving circuit DC may be insulated from the second capacitor electrode 252 of the corresponding pixel driving circuit DC by the capacitor insulating layer 253 of the corresponding pixel driving circuit DC. The capacitor insulating layer 253 of each pixel driving circuit DC may be formed using a process of forming the thin film transistors T1, T2 and T3 of the corresponding pixel driving circuit DC. For example, the capacitor insulating layer 253 of each pixel driving circuit DC may be formed simultaneously with the second gate insulating layer 222 of the corresponding pixel driving circuit DC. The capacitor insulating layer 253 of each pixel driving circuit DC may include a same material as the second gate insulating layer 222 of the corresponding pixel driving circuit DC. Thus, in the display apparatus according to the aspect of the present disclosure, a formation process of each pixel driving circuit DC may be simplified.

A light-blocking pattern 105 may be disposed between the device substrate 100 and the second thin film transistor T2 of each pixel driving circuit DC. The light-blocking pattern 105 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may overlap with the second semiconductor patterns 221 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The light-blocking pattern 105 may include a material capable of blocking light. External light travelling in a direction of the second semiconductor patterns 221 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ passing through the device substrate 100 may be blocked by the light-blocking pattern 105 in the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. Thus, in the display apparatus according to the aspect of the present disclosure, changes in the characteristics of the second thin film transistor T2 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ due to the external light may be prevented.

The light-blocking pattern 105 may include a conductive material. For example, the light-blocking pattern 105 may include a metal, such as aluminum (Al), chrome (Cr), copper (Cu), molybdenum (Mo), titanium (Ti) and tungsten (W). The light-blocking pattern 105 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be spaced apart from the second semiconductor pattern 221 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the light-blocking pattern 105 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed between the device substrate 100 and the device buffer layer 110.

A specific voltage may be applied to the light-blocking pattern 105 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the light-blocking pattern 105 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the second drain electrode 225 of the corresponding pixel area $PX_{ij-1}$, $PX_{ij}$, $PX_{i(j+1)}$, $PX_{(i+1)(j-1)}$, $PX_{(i+1)j}$ and $PX_{(i+1)(j+1)}$. The second drain electrode of each pixel driving circuit DC may be electrically connected to the second capacitor electrode 252 of the corresponding pixel driving circuit DC. For example, the second capacitor electrode 252 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the light-blocking pattern 105 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The second capacitor electrode 252 of each pixel driving circuit DC may extend beyond the first capacitor 251 in the corresponding pixel driving circuit DC. For example, the second capacitor electrode 252 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be in direct contact with the second drain electrode 225 and the light-blocking pattern 105 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

The data lines $DL_{(j-1)}$, $DL_j$ and $DL_{(j+1)}$, the power voltage supply lines PL and the reference voltage supply lines RL may be formed simultaneously with the light-blocking pattern 105. The data lines $DL_{(j-1)}$, $DL_j$ and $DL_{(j+1)}$, the power voltage supply lines PL and the reference voltage supply lines RL may be disposed on a same layer as the light-blocking pattern 105. The data lines $DL_{(j-1)}$, $DL_j$ and $DL_{(j+1)}$, the power voltage supply lines PL and the reference voltage supply lines RL may include a same material as the light-blocking pattern 105. Thus, in the display apparatus according to the aspect of the present disclosure, the number of masks to form the light-blocking pattern 105 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$, the data lines $DL_{(j-1)}$, $DL_j$ and $DL_{(j+1)}$, the power voltage supply lines PL, the reference voltage supply lines RL may be minimized.

Each of the power voltage supply lines PL may be electrically connected to the first connection wiring 310 through a first intermediate electrode 410. The first intermediate electrode 410 may include a conductive material. The first intermediate electrode 410 may have a relatively low resistance. For example, the first intermediate electrode 410 may include a metal, such as aluminum (Al), chrome (Cr), copper (Cu), molybdenum (Mo), titanium (Ti) and tungsten (W). The first intermediate electrode 410 may be disposed on a layer different from the first connection wiring 310. For example, a portion of the first connection wiring 310 may be covered by a first intermediate insulating layer 121, the first intermediate electrode 410 disposed on the first intermediate insulating layer 121 may include a region being in direct contact with the first upper wiring layer 312 of the first connection wiring 310 by penetrating the first intermediate insulating layer 121, and a region being in direct contact with the corresponding power voltage supply line PL by penetrating the first intermediate insulating layer 121 and the device buffer layer 110, as shown in FIG. 5.

The intermediate insulating layer 121 may include an insulating material. For example, the first intermediate insulating layer 121 may include an inorganic insulating material, such as silicon oxide (SiOx) and silicon nitride (SiNx). The first intermediate insulating layer 121 may be formed by a process of forming the thin film transistors T1, T2 and T3 of each pixel driving circuit DC. For example, the intermediate insulating layer 121 may be formed simultaneously with the second gate insulating layer 222 of each pixel driving circuit DC. The first intermediate electrode 410 may include a same material as the second gate electrode 223 of each pixel driving circuit DC. For example, the first intermediate electrode 410 may be formed simultaneously with the second gate electrode 223 of each pixel driving circuit DC. Thus, in the display apparatus according to the aspect of the present disclosure, process efficiency may be improved.

Each of the reference voltage supply lines RL may be electrically connected to the second connection wiring 320 through a second intermediate electrode 420. The second intermediate electrode 420 may include a conductive material. The second intermediate electrode 420 may have a relatively low resistance. For example, the second intermediate electrode 420 may include a metal, such as aluminum (Al), chrome (Cr), copper (Cu), molybdenum (Mo), titanium (Ti) and tungsten (W). The second intermediate electrode 420 may be disposed on a layer different from the second connection wiring 320. The second intermediate electrode 420 may be disposed on a same layer as the first intermediate electrode 410. The second intermediate electrode 420 may be formed simultaneously with the first intermediate electrode 410. For example, a portion of the second connection wiring 320 may be covered by a second intermediate insulating layer, and the second intermediate electrode 420 disposed on the second intermediate insulating layer may include a region being in direct contact with the second upper wiring layer of the second connection wiring 320 by penetrating the second intermediate insulating layer, and a region being in direct contact with the corresponding reference voltage supply line RL by penetrating the second intermediate insulating layer and the device buffer layer 110.

The second intermediate insulating layer may include an insulating material. For example, the second intermediate insulating layer may include an inorganic insulating material, such as silicon oxide (SiOx) and silicon nitride (SiNx). The second intermediate insulating layer may be formed simultaneously with the first intermediate insulating layer 121. For example, the second intermediate insulating layer may include a same material as the first intermediate insulating layer 121. Thus, in the display apparatus according to the aspect of the present disclosure, process efficiency may be improved.

The lower passivation layer 130 may be disposed on each pixel driving circuit DC. The lower passivation layer 130 may prevent damages of each pixel driving circuit DC due to external moisture and impact. For example, a surface of each pixel driving circuit DC opposite to the device substrate 100 may be completely covered by the lower passivation layer 130. The lower passivation layer 130 may extend beyond each pixel driving circuit DC. For example, the lower passivation layer 130 may be a linear layer having a constant thickness. The lower passivation layer 130 may include an insulating material. For example, the lower passivation layer 130 may include an inorganic insulating material, such as silicon oxide (SiOx) and silicon nitride (SiNx).

The over-coat layer 140 may be disposed on the lower passivation layer 130. The over-coat layer 140 may remove a thickness difference due to each pixel driving circuit DC. For example, an upper surface of the over-coat layer 140 opposite to the device substrate 100 may be a flat surface. The over-coat layer 140 may include an insulating material. The over coat layer 140 may include a material different from the lower passivation layer 130. For example, the over-coat layer 140 may include an organic insulating material.

The light-emitting device 500 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed on the over-coat layer 140. The light-emitting device 500 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may emit light displaying a specific color. For example, the light-emitting device 500 may include a lower electrode 510, a light-emitting layer 520 and an upper electrode 530, which are disposed on the over-coat layer 140 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

The lower electrode 510 may be disposed close to the over-coat layer 140. For example, a lower surface of the lower electrode 510 toward the device substrate 100 may be in direct contact with the upper surface of the over-coat layer 140. Thus, in the display apparatus according to the aspect of the present disclosure, luminance deviation according to generating locations of the light emitted from each light-emitting device 500 may be prevented. The lower electrode 510 may include a conductive material. The lower electrode 510 may include a material having a relatively high transmittance. For example, the lower electrode 510 may be a transparent electrode made of a transparent conductive material, such as ITO and IZO.

The light-emitting layer 520 may generate light having luminance corresponding to a voltage difference between the lower electrode 510 and the upper electrode 530. For example, the light-emitting layer 520 may include an emission material layer (EML) having an emission material. The emission material may include an organic material, an inorganic material or a hybrid material. For example, the display apparatus according to the aspect of the present disclosure may be an organic light-emitting display apparatus including an organic emission material.

The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display apparatus according to the aspect of the present disclosure, the emission efficiency of the light-emitting layer 520 may be improved.

The upper electrode 530 may include a conductive material. The upper electrode 530 may include a material different from the lower electrode 510. The upper electrode 530 may have a reflectance higher than the lower electrode 510. For example, the upper electrode 530 may include a metal, such as aluminum (Al) and silver (Ag). Thus, in the display apparatus according to the aspect of the present disclosure, the light generated by the light-emitting layer 520 may be emitted outside through the lower electrode 510 and the device substrate 100.

The lower electrode 510 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the second thin film transistor T2 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the lower electrode 510 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be in direct contact with the second capacitor electrode 252 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ by penetrating the lower passivation layer 130 and the over-coat layer 140, as shown in FIG. 6. Thus, in the display apparatus according to the aspect of the present disclosure, the driving current generated by the pixel driving circuit DC of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be supplied to the lower electrode 510 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ for one frame.

The light-emitting device 500 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be independently controlled from the light-emitting device of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the bank insulating layer 150 disposed on the over-coat layer 140 may cover an edge of the lower electrode 510 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The lower electrode 510 of each light-emitting device 500 may be insulated from the lower electrode 510 of adjacent light-emitting device 500 by the bank insulating layer 150.

The light-emitting layer 520 and the upper electrode 530 of each light-emitting device 500 may be sequentially stacked on the portion of the lower electrode 510 of the corresponding light-emitting device 500 exposed by the bank insulating layer 150. For example, the bank insulating layer 150 may define an emission area EA in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The light-emitting layer 520 of each light-emitting device 500 may extend onto the bank insulating layer 150. For example, the light-emitting layer 520 of each light-emitting device 500 may be connected to the light-emitting layer 520 of adjacent light-emitting device 500. The light emitted from each light-emitting device 500 may display a same color as the light emitted from adjacent light-emitting device 500. For example, each of the light-emitting devices 500 may emit white light.

Each of the pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may display a color different from adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, a color filter 800 overlapping with the emission area EA may be disposed in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The color filter 800 may realize a specific color using light passing through. For example, the color filter 800 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed on a path of the light emitted from the light-emitting device 500 in the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The color filter 800 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed on the light-emitting device 500 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ and the device substrate 100. For example, the color filter 800 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed between the lower passivation layer 130 and the over-coat layer 140 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. A thickness difference due to the color filter 800 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be removed by the over-coat layer 140.

A voltage applied to the upper electrode 530 of each light-emitting device 500 may be the same as a voltage applied to the upper electrode 530 of adjacent light-emitting device 500. For example, the upper electrode 530 of each light-emitting device 500 may be electrically connected to the upper electrode 530 of adjacent light-emitting device 500. The upper electrode 530 of each light-emitting device 500 may include a same material as the upper electrode 530 of adjacent light-emitting device 500. For example, the upper electrode 530 of each light-emitting device 500 may be formed simultaneously with the upper electrode 530 of adjacent light-emitting device 500. Thus, in the display apparatus according to the aspect of the present disclosure, a process of forming the upper electrode 530 of each light-emitting device 500 may be simplified. And, in the display apparatus according to the aspect of the present disclosure, the luminance of the light emitted from the light-emitting device 500 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be adjusted by the data signal applied to the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

An encapsulation substrate 700 may be disposed on the upper electrode 530 of each light-emitting device 500. The encapsulation substrate 700 may prevent damages of the light-emitting devices 500 due to the external impact and moisture. For example, the encapsulation substrate 700 may include a material having a certain strength or higher. The encapsulation substrate 700 may include a material having a relatively high thermal conductivity. For example, the encapsulation substrate 700 may include a metal, such as aluminum (Al), nickel (Ni) and iron (Fe). Thus, in the display apparatus according to the aspect of the present disclosure, heat generated by the pixel driving circuit DC and the light-emitting device 500 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be emitted through the encapsulation substrate 700. Therefore, in the display apparatus according to the aspect of the present disclosure, deterioration of the light-emitting layer 520 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be minimized.

The encapsulation substrate 700 may be attached to the device substrate 100 in which the light-emitting devices 500 are formed. For example, an encapsulating element 600 may be disposed in a space between the light-emitting devices 500 and the encapsulation substrate 700. The encapsulating element 600 may include an adhesive material. The encapsulating element 600 may include an insulating material. For example, the encapsulating element 600 may include an olefin-based material. The encapsulating element 600 may have a relatively low water vapor transmission rate (WVTR). Thus, in the display apparatus according to the aspect of the present disclosure, penetration of the external moisture through the encapsulating element 600 may be blocked.

A repair connecting area RA and a repair releasing area CA may be defined in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair connecting area RA and the repair releasing area CA of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be defined outside the pixel driving circuit DC and the lower electrode 510 in the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

The repair connecting area RA of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be a region for a repair connection process of electrically connecting the pixel driving circuit DC of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ to the light-emitting device 500 of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$, when the pixel driving circuit DC of adjacent pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ does not normally operate. The repair releasing area CA may be a region for a repair release process of releasing an electrical connection by the repair connection process, when the light-emitting device 500 of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ connected by the repair connection process does not normally operate. For example, a repair wiring 107 extending on the repair connecting area RA of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ crossing the repair releasing area CA of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed in the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The repair releasing area CA of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be defined between the repair connecting area RA and the pixel driving circuit DC of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may include an end overlapping with the repair connecting area RA of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

The repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed closer to the device substrate 100 than the lower electrode 410 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed between the device substrate 100 and the device buffer layer 110, as shown in FIG. 7. The repair wiring 107 may include a conductive material. For example, the repair wiring 107 may include a metal, such as aluminum (Al), chrome (Cr), copper (Cu), molybdenum (Mo), titanium (Ti) and tungsten (W). The repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed on a same layer as the light-blocking pattern 105 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be formed simultaneously with the light-blocking pattern 105 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may include a same material as the light-blocking pattern 105 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

The repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the pixel driving circuit DC of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the second drain electrode 225 of the second thin film transistor T2 in the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The repair wiring 107 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the second drain electrode 225 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ through the light-blocking pattern 105 and the second capacitor electrode 252 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the light-blocking pattern 105 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be in direct contact with the repair wiring 107 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$.

The lower electrode 510 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may include a repair protruding portion 510p extending on the repair connecting area RA of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may extend in the first direction, as shown in FIGS. 3 and 4. The repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may include a region overlapping with the repair connecting area RA of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction. Thus, in the display apparatus according to the aspect of the present disclosure, the light-emitting device 500 of the pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in which the pixel driving circuit DC does not normally operate may be electrically connected to the pixel driving circuit DC of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction. For example, each of the pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may realize a same color as adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction. The repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may not overlap with the repair releasing area CA of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction.

The repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may include a same material as the lower electrode 510 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed on a same layer as the lower electrode 510 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. For example, the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be disposed on the over-coat layer 140, as shown in FIG. 7.

A third intermediate electrode 430 may be disposed in the repair connecting area RA of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. The third intermediate electrode 430 may include a conductive material. For example, the third intermediate electrode 430 may include a metal, such as aluminum (Al), chrome (Cr), copper (Cu), molybdenum (Mo), titanium (Ti) and tungsten (W). The third intermediate electrode 430 may include a same material as the first intermediate electrode 410 and the second intermediate electrode 420. The third intermediate electrode 430 may be formed simultaneously with the first intermediate electrode 410 and the second intermediate electrode 420. For example, the third intermediate electrode 430 may be disposed between the device buffer layer 110 and the lower passivation layer 130. A third intermediate insulating layer 123 may be disposed between the device buffer layer 110 and the third intermediate electrode 430. The third intermediate insulating layer 123 may be formed simultaneously with the first intermediate insulating layer 121 and the second intermediate insulating layer. For example, the third intermediate insulating layer 123 may be formed simultaneously with the first intermediate insulating layer 121 and the second intermediate insulating layer.

The repair protruding portion 510$p$ of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be electrically connected to the third intermediate electrode 430 disposed in the repair connecting area RA of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction. For example, the lower passivation layer 130 and the over-coat layer 140 may include connection contact holes partially exposing the third intermediate electrode 430 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$, and the repair protruding portion 510$p$ of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be in direct contact with the third intermediate electrode 430 of adjacent pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction through one of the connection contact holes. That is, in the display apparatus according to the aspect of the present disclosure, the repair connection process may be finished by connecting the repair wiring 107 and the third intermediate electrode 430 of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. Thus, in the display apparatus according to the aspect of the present disclosure, time required for the repair connection process may be minimized. Therefore, in the display apparatus according to the aspect of the present disclosure, damage and deterioration of peripheral components due to the repair connection process may be prevented.

Figure 8:
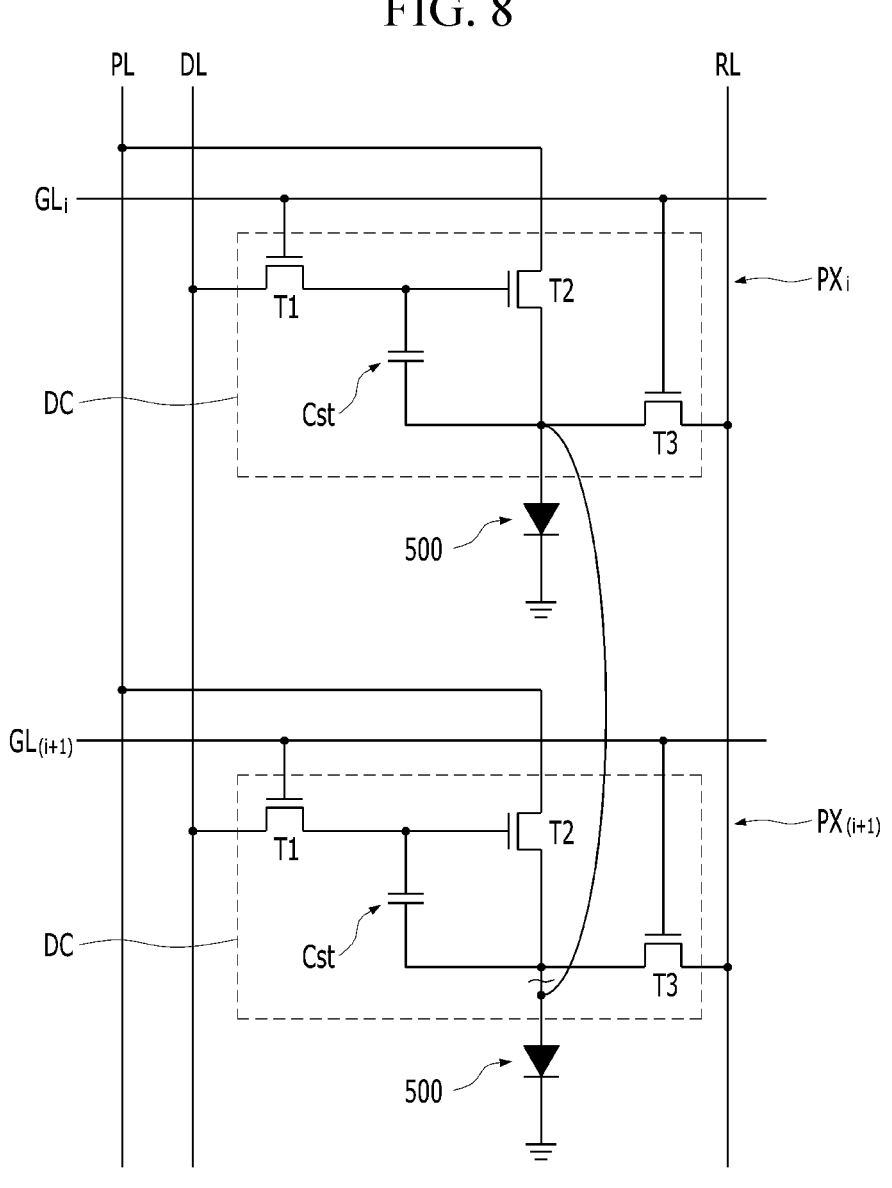
Figure 9:
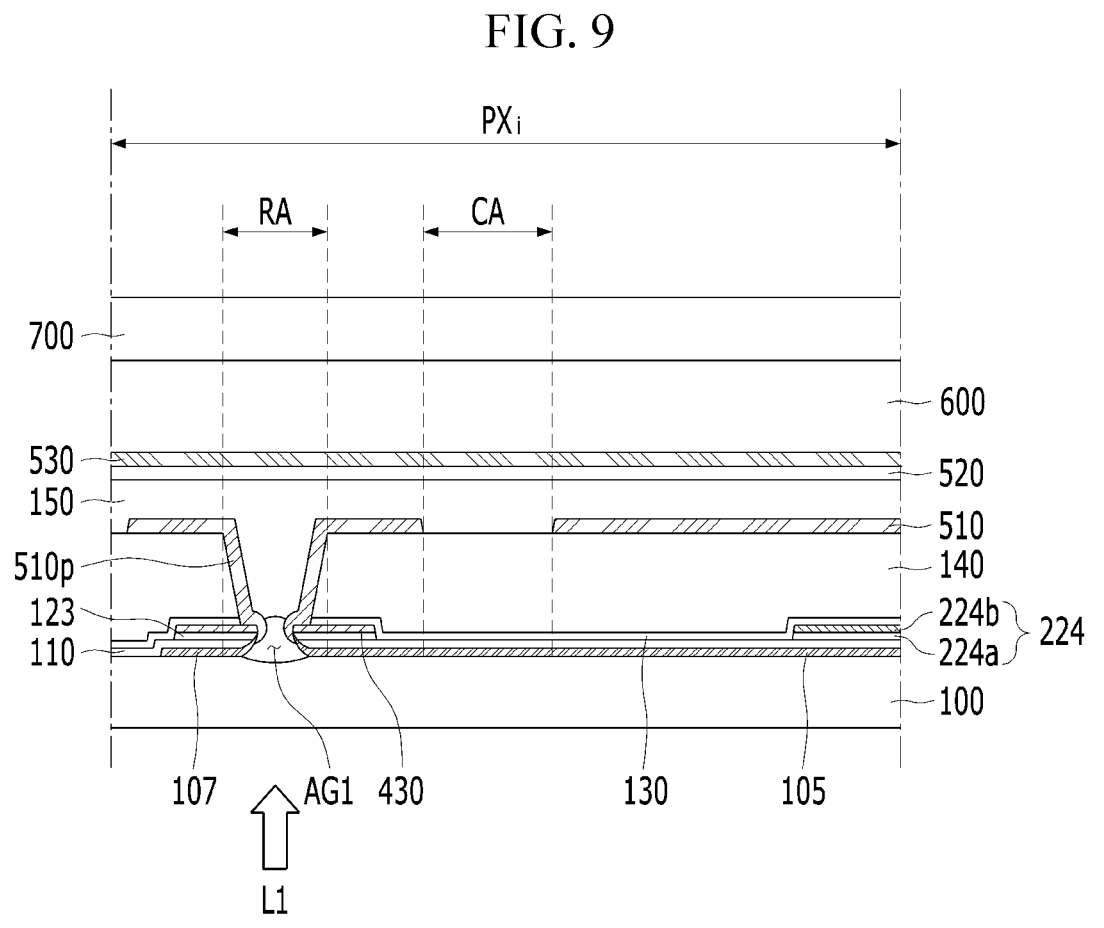

FIGS. 8 and 9 are views for explaining a repair connection process in the display apparatus according to the aspect of the present disclosure.

Referring to FIGS. 8 and 9, in the display apparatus according to the aspect of the present disclosure, the light-emitting device 500 of (i+1)-th pixel area PX (i+1) in which the pixel driving circuit DC does not normally operate may be insulated from the corresponding pixel driving circuit DC, and the repair protruding portion 510$p$ of the (i+1)-th pixel area $PX_{(i+1)}$ may be electrically connected to the repair wiring 107 of i-th pixel area PX; in the repair connecting area RA of the i-th pixel area PX; by irradiation of first laser L1.

Conductive layers and insulating layers disposed in the repair connecting area RA of the i-th pixel area PX; may be melted and/or transformed by the first laser L1. For example, a portion of the repair wiring 107 in the i-th pixel area PX; may be curved in a direction of the repair protruding portion 510$p$ of the (i+1)-th pixel area $PX_{(i+1)}$ disposed in the repair connecting area RA of the i-th pixel area PX; by the first laser L1. The repair protruding portion 510$p$ of the (i+1)-th pixel area $PX_{(i+1)}$ may be in direct contact with the curved portion of the repair wiring 107 disposed in the i-th pixel area PX$_i$. For example, the repair protruding portion 510$p$ of the (i+1)-th pixel area $PX_{(i+1)}$ may be melted by the first laser L1, and flow down onto the curved portion of the repair wiring 107 disposed in the i-th pixel area PX$_i$. A first air-gap AG1 due to irradiation of the first laser L1 may be formed in the repair connecting area RA of the i-th pixel area PX$_i$. For example, the first air-gap AG1 formed in the repair connecting area RA of the i-th pixel area PX; may be surrounded by the curved portion of the repair wiring 107 in the i-th pixel area PX; and the repair protruding portion 510$p$ of the (i+1)-th pixel area $PX_{(i+1)}$.

Figure 10:
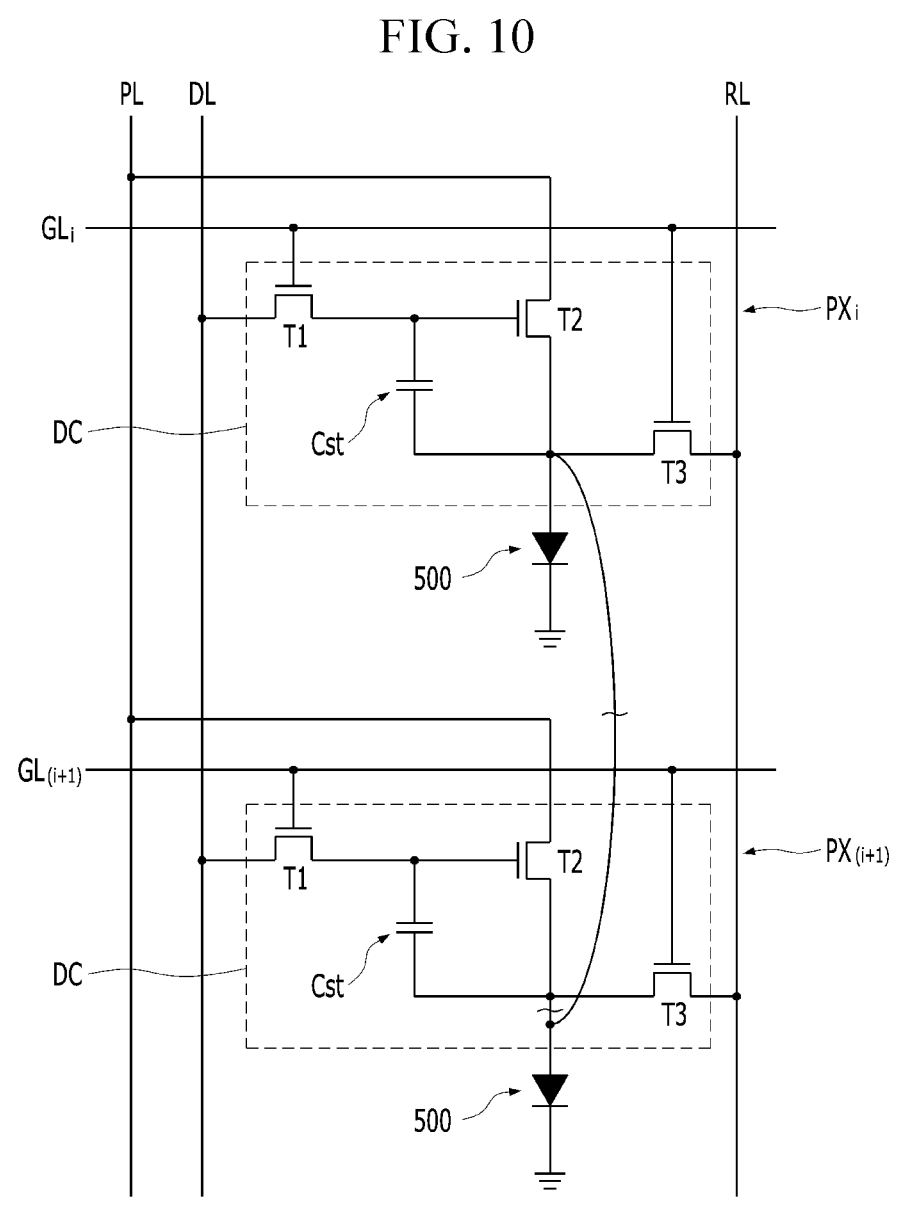
Figure 11:
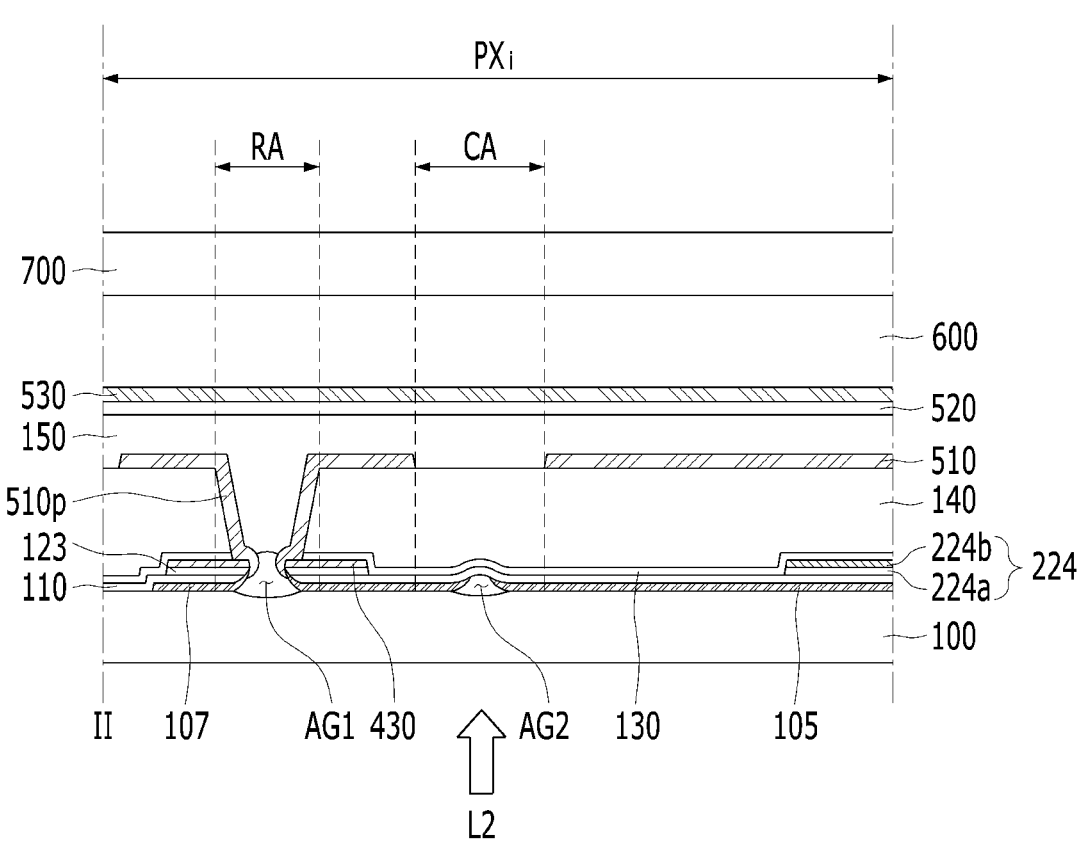

FIGS. 10 and 11 are views for explaining a repair release process in the display apparatus according to the aspect of the present disclosure.

Referring to FIGS. 10 and 11, in the display apparatus according to the aspect of the present disclosure, the repair wiring 107 of the i-th pixel area PX$_i$ may be disconnected in the repair releasing area CA of the i-th pixel area PX; by irradiation of a second laser L2, when the light-emitting device 500 of the (i+1)-th pixel area $PX_{(i+1)}$ electrically connected to the pixel driving circuit DC of i-th pixel area PX$_i$ by the repair connection process does not normally operate.

The disconnection process of the repair wiring 107 in the i-th pixel area PX$_i$ may include a process of removing a portion of the repair wiring 107 disposed in the repair releasing area CA of i-th pixel area PX$_i$ using the second laser L2. The repair wiring 107 of the i-th pixel area PX$_i$ may be disposed close to the upper surface of the device substrate 100. Thus, in the display apparatus according to the aspect of the present disclosure, the output of the second laser L2 used in the repair release process may be lowered. That is, in the display apparatus according to the aspect of the present disclosure, the damage and the deterioration of the peripheral components due to the second laser L2 used in the repair release process may be prevented. For example, in the display apparatus according to the aspect of the present disclosure, the second laser L2 may not affect the upper electrode 530 of each light-emitting device 500. Therefore, in the display apparatus according to the aspect of the present disclosure, damage of the upper electrode 530 and generation of a dark spot due to the second laser L2 may be prevented. And, in the display apparatus according to the aspect of the present disclosure, process efficiency may be improved by reducing time consumed in the repair release process.

Accordingly, the display apparatus according to the aspect of the present disclosure may include the pixel driving circuit DC, the light-emitting device 500 and the repair wiring 107 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ of the device substrate 100, wherein the pixel driving circuit DC may be electrically connected to the lower electrode 510 of the light-emitting device 500 and the repair wiring 107, and wherein the repair wiring 107 disposed closer to the device substrate 100 than the lower electrode 510 may overlap with the repair connecting area RA and the repair releasing area CA, which are defined outside the lower electrode 510 and the pixel driving circuit DC. Thus, in the display apparatus according to the aspect of the present disclosure, the repair release process may be finished by disconnecting the repair wiring 107. That is, in the display apparatus according to the aspect of the present disclosure, the laser used in the repair release process may not affect the upper electrode 530 in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$. Therefore, in the display apparatus according to the aspect of the present disclosure, the generation of the dark spot due to the repair release process may be prevented.

The display apparatus according to the aspect of the present disclosure is described that the data driver DD, the gate driver GD and the power unit PU are arranged outside the display panel DP. However, in the display apparatus according to another aspect of the present disclosure, at least one of the data driver DD, the gate driver GD and the power unit PU may be disposed on the display panel DP. For example, the display apparatus according to another aspect of the present disclosure may be a Gate-In-Panel (GIP) type display apparatus in which the gate driver GD is mounted on the bezel area BZ of the display panel DP.

The display apparatus according to the aspect of the present disclosure is described that the first thin film transistor T1, the second thin film transistor T2 and the third thin film transistor T3 of each pixel driving circuit DC are simultaneously formed. However, in the display apparatus according to another aspect of the present disclosure, the first semiconductor pattern of the first thin film transistor T1, the second semiconductor pattern 221 of the second thin film transistor T2 and the third semiconductor pattern of the third thin film transistor T3 may be disposed on a layer different from each other. For example, in the display apparatus according to another aspect of the present disclosure, the first semiconductor pattern of the first thin film transistor T1 and the third semiconductor pattern of the third thin film transistor T3 may include a material different from the second semiconductor pattern 221 of the second thin film transistor T2. The first semiconductor pattern of the first thin film transistor T1 and the third semiconductor pattern of the third thin film transistor T3 may have a characteristics different from the second semiconductor pattern 221 of the second thin film transistor T2. For example, the first semiconductor pattern of the first thin film transistor T1 and the third semiconductor pattern of the third thin film transistor T3 may be formed of a low-temperature Poly-Si (LTPS), and the second semiconductor pattern 221 of the second thin film transistor T2 may be formed of an oxide semiconductor. Thus, in the display apparatus according to another aspect of the present disclosure, the degree of freedom in the configuration of each pixel driving circuit DC may be improved.

The display apparatus according to the aspect of the present disclosure is described that the third thin film transistor T3 is turn-on/off simultaneously with the first thin film transistor T1. However, in the display apparatus according to another aspect of the present disclosure, the third thin film transistor T3 may be controlled independently from the first thin film transistor T1. For example, in the display apparatus according to another aspect of the present disclosure, the signal wirings GL, DL, PL and RL may include initialization wirings sequentially applying an initialization signal, and the third drain electrode of each pixel driving circuit DC may be electrically connected to one of the initialization wirings. Thus, in the display apparatus according to another aspect of the present disclosure, the degree of freedom in the configuration of each pixel driving circuit DC may be improved.

Figure 12:
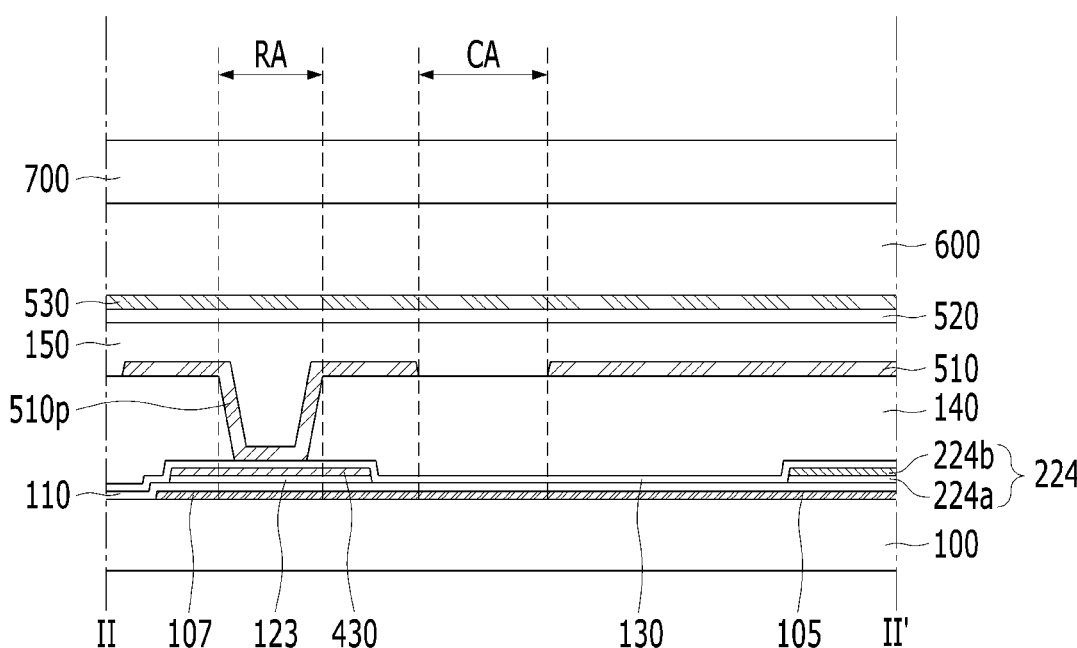
FIGS. 12 to 14 are views showing the display apparatus according to another aspect of the present disclosure.

The display apparatus according to the aspect of the present disclosure is described that the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ is in contact with the third intermediate electrode 430 of adjacent pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction by the connection contact holes. However, in the display apparatus according to another aspect of the present disclosure, the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be connected to the third intermediate electrode 430 of adjacent pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction by the repair connection process. For example, in the display apparatus according to another aspect of the present disclosure, the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be insulated from the third intermediate electrode 430 of adjacent pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction before performing the repair connection process, as shown in FIG. 12. Thus, in the display apparatus according to another aspect of the present disclosure, the degree of freedom in the configuration of the repair connecting area RA defined in each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be improved.

Figure 13:
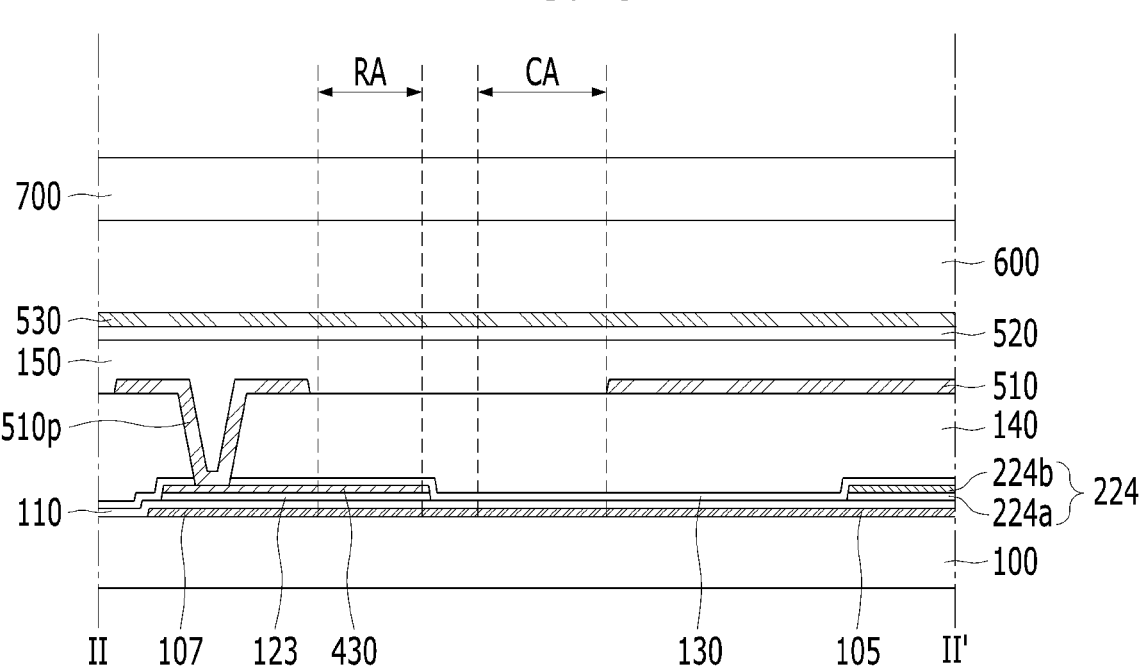
Figure 14:
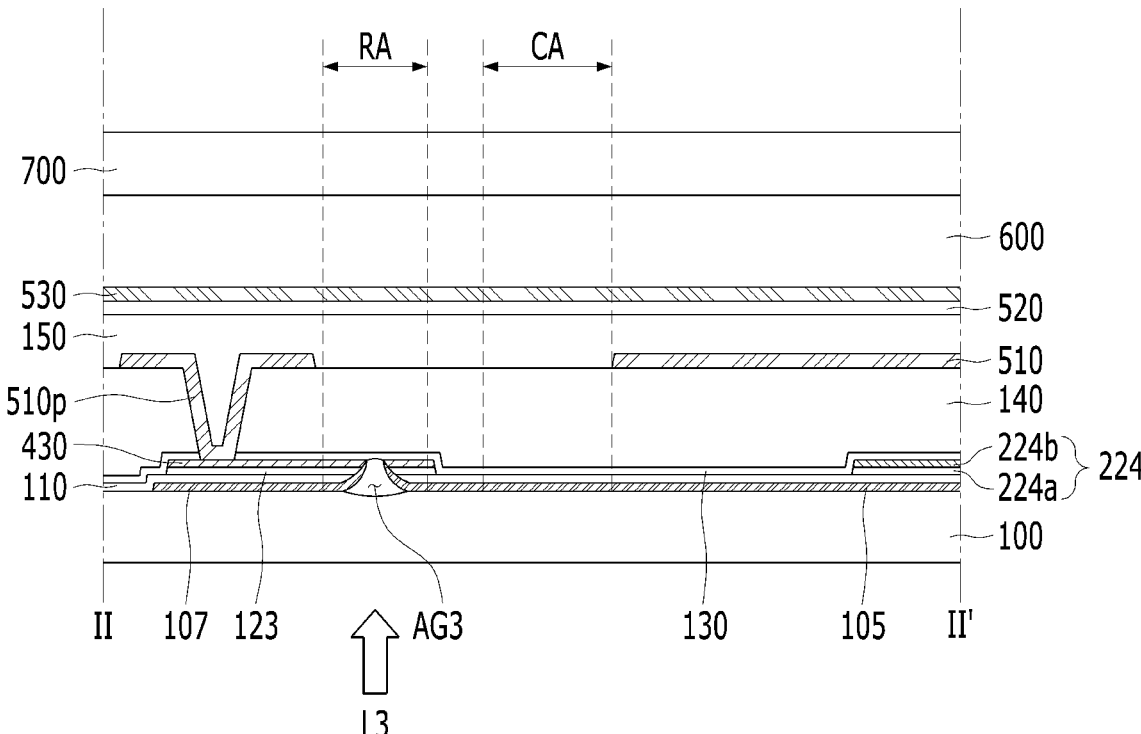

The display apparatus according to the aspect of the present disclosure is described that the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ includes a region overlapping with the repair connecting area RA of adjacent pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction. However, in the display apparatus according to another aspect of the present disclosure, the repair protruding portion 510p of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be connected to the third intermediate electrode 430 of adjacent pixel areas $PX_{i(j-1)}$, $PX_{ij}$, $PX_{i(j+1)}$, $PX_{(i+1)(j-1)}$, $PX_{(i+1)j}$ and $PX_{(i+1)(j+1)}$ in the first direction at the outside of the repair connecting area RA defined in the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$, as shown in FIGS. 13 and 14. Thus, in the display apparatus according to another aspect of the present disclosure, an air-gap AG3 formed by a third laser L3 irradiated for the repair connecting process at the repair connecting area RA of each pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ may be surrounded by the repair wiring 107 of the corresponding pixel area $PX_{i(j-1)}$, $PX_{ij}$, $PX_{i(j+1)}$, $PX_{(i+1)(j-1)}$, $PX_{(i+1)j}$ and $PX_{(i+1)(j+1)}$ and the third intermediate electrode 430. Thus, in the display apparatus according to another aspect of the present disclosure, the degree of freedom in the configuration for the repair connecting process may be improved.

In the result, the display apparatus according to the aspects of the present disclosure may comprise the pixel driving circuit, the light-emitting device and the repair wiring in each pixel area of the device substrate, wherein the repair wiring of each pixel area may overlap with the repair connecting area and the repair releasing area of the corresponding pixel area, wherein the repair connecting area and the repair releasing area of each pixel area may be defined outside the lower electrode of the light-emitting device and the pixel driving circuit in the corresponding pixel area, and wherein the repair wiring of each pixel area may be disposed closer to the device substrate than the lower electrode. That is, in the display apparatus according to the aspects of the present disclosure, the light-emitting device of each pixel area may be disposed on at least one insulating layer covering the repair wiring of the corresponding pixel area, and the repair wiring of each pixel area may be disconnected by the repair release process. Thus, in the display apparatus according to the aspects of the present disclosure, the effect on the upper electrode of each light-emitting device due to the repair release process may be minimized. Thereby, in the display apparatus according to the aspects of the present disclosure, the damage of the upper electrode and the generation of the dark spot due to the repair release process may be prevented.

What is claimed is:

1. A display apparatus comprising:
   a pixel driving circuit disposed on a pixel area of a device substrate;
   a light-emitting device electrically connected to the pixel driving circuit and including a lower electrode, a light-emitting layer and an upper electrode, which are sequentially stacked on the pixel area; and
   a repair wiring electrically connected to the pixel driving circuit and overlapping with a repair connecting area and a repair releasing area of the pixel area,
   wherein the repair connecting area and the repair releasing area are defined outside the pixel driving circuit and the lower electrode, and
   wherein the repair wiring is disposed closer to the device substrate than the lower electrode.

2. The display apparatus according to claim 1, wherein the repair releasing area is defined between the repair connecting area and the pixel driving circuit, and an end of the repair wiring overlaps with the repair connecting area.

3. The display apparatus according to claim 1, wherein the pixel driving circuit includes a driving thin film transistor, and
   wherein the lower electrode and the repair wiring are electrically connected to a drain electrode of the driving thin film transistor.

4. The display apparatus according to claim 3, wherein the repair wiring is disposed on a layer different from the drain electrode of the driving thin film transistor.

5. The display apparatus according to claim 3, further comprising a light-blocking pattern between the device substrate and the driving thin film transistor,
   wherein the light-blocking pattern overlaps with a semi-conductor pattern of the driving thin film transistor, and
   wherein the repair wiring is disposed on a same layer as the light-blocking pattern.

6. The display apparatus according to claim 5, wherein the repair wiring includes a same material as the light-blocking pattern.

7. The display apparatus according to claim 5, wherein the repair wiring is electrically connected to the light-blocking pattern.

8. The display apparatus according to claim 7, wherein the repair wiring is in contact with the light-blocking pattern.

9. The display apparatus according to claim 1, further comprising:
   an over-coat layer between the device substrate and the light-emitting device;
   a device buffer layer between the device substrate and the over-coat layer; and
   a lower passivation layer between the device buffer layer and the over-coat layer,
   wherein the pixel driving circuit includes at least one thin film transistor between the device buffer layer and the lower passivation layer, and
   wherein the repair wiring is disposed between the device substrate and the device buffer layer.

10. The display apparatus according to claim 9, wherein the repair wiring is in contact with an upper surface of the device substrate toward the light-emitting device.

11. A display apparatus comprising:
   a device substrate including a first pixel area and a second pixel area, which are disposed side by side in a first direction;
   a first light-emitting device including a first lower electrode, a first light-emitting layer and a first upper electrode, which are sequentially stacked on the first pixel area of the device substrate;
   a first pixel driving circuit disposed on the first pixel area and electrically connected to the first lower electrode of the first light-emitting device;
   a second light-emitting device including a second lower electrode, a second light-emitting layer and a second upper electrode, which are sequentially stacked on the second pixel area of the device substrate;
   a second pixel driving circuit disposed on the second pixel area, the second pixel driving circuit insulated from the second light-emitting device; and
   a repair wiring in the first pixel area, the repair wiring electrically connected to the first pixel driving circuit,
   wherein the repair wiring extends onto a repair connecting area of the first pixel area crossing a repair releasing area of the first pixel area, the repair connecting area and the repair releasing area being disposed outside the first pixel driving circuit and the first lower electrode,
   wherein the first lower electrode and the second lower electrode are disposed on at least one insulating layer covering the repair wiring, and
   wherein the second lower electrode includes a repair protruding portion which extends in the first direction, and is electrically connected to the repair wiring in the repair connecting area.

12. The display apparatus according to claim 11, wherein the repair protruding portion is disposed on a same layer as the first lower electrode and the second lower electrode.

13. The display apparatus according to claim 11, wherein a portion of the repair wiring in the repair connecting area is curved toward the repair protruding portion, and the repair protruding portion is in contact with a curved portion of the repair wiring.

14. The display apparatus according to claim 13, further comprising a first air-gap in the repair connecting area, the first air-gap surrounded by the curved portion of the repair wiring and the repair protruding portion.

15. The display apparatus according to claim 13, further comprising an intermediate electrode between the repair wiring and the repair protruding portion in the repair connecting area.

16. The display apparatus according to claim 15, wherein the repair protruding portion of each of the first pixel area and the second pixel area is insulated from the intermediate electrode of an adjacent pixel area in the first direction before performing a repair connection process.

17. The display apparatus according to claim 16, wherein the repair protruding portion of each of the first pixel area and the second pixel area is connected to the intermediate electrode of an adjacent pixel area in the first direction at the outside of the repair connecting area of a respective pixel area.

18. The display apparatus according to claim 15, wherein a second air-gap is formed by irradiating a laser at the repair connecting area of each of the first pixel area and the second pixel area, and wherein the second air-gap is surrounded by the repair wiring of a respective pixel area and the intermediate electrode.

19. A display apparatus comprising:
   a device substrate including a first pixel area and a second pixel area, which are disposed side by side in a first direction;
   a first light-emitting device including a first lower electrode, a first light-emitting layer and a first upper electrode, which are sequentially stacked on the first pixel area of the device substrate;

a first pixel driving circuit disposed on the first pixel area, the first pixel driving circuit electrically connected to the first lower electrode of the first light-emitting device;

a second light-emitting device including a second lower electrode, a second light-emitting layer and a second upper electrode, which are sequentially stacked on the second pixel area of the device substrate;

a second pixel driving circuit on the second pixel area, the second pixel driving circuit insulated from the second light-emitting device; and a repair wiring disposed in the first pixel area and electrically connected to the first pixel driving circuit, wherein the repair wiring extends onto a repair connecting area of the first pixel area crossing a repair releasing area of the first pixel area, which is disposed outside the first pixel driving circuit and the first lower electrode, wherein the first lower electrode and the second lower electrode are disposed on at least one insulating layer covering the repair wiring, and wherein the second lower electrode includes a repair protruding portion which extends in the first direction, and overlaps with the repair wiring in the first pixel area.

20. The display apparatus according to claim 19, wherein the repair protruding portion does not overlap with the repair releasing area.

* * * * *